(12) United States Patent
Resnick (10) Patent No.: US 7,692,996 B2
(45) Date of Patent: Apr. 6, 2010

(54) METHOD, SYSTEM, AND APPARATUS FOR VOLTAGE SENSING AND REPORTING

(75) Inventor: David R. Resnick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 274 days.

(21) Appl. No.: 11/830,531

(22) Filed: Jul. 30, 2007

(65) Prior Publication Data

US 2009/0034354 A1 Feb. 5, 2009

(51) Int. Cl.
*G11C 5/14* (2006.01)
(52) U.S. Cl. .................................. 365/226; 365/189.07
(58) Field of Classification Search ................. 365/226, 365/189.07, 185.24
See application file for complete search history.

(56) References Cited

U.S. PATENT DOCUMENTS

| | | | |
|---|---|---|---|
| 4,428,020 A | 1/1984 | Blanchard, Jr. | |
| 5,994,950 A | 11/1999 | Ochi | |
| 6,753,722 B1 | 6/2004 | Kondapalli et al. | |
| 6,864,693 B2 | 3/2005 | Kondo et al. | |
| 6,934,210 B2 * | 8/2005 | Akiba et al. | 365/222 |
| 7,088,636 B2 * | 8/2006 | Akiba et al. | 365/226 |
| 7,109,783 B1 | 9/2006 | Kondapalli et al. | |

FOREIGN PATENT DOCUMENTS

| | | |
|---|---|---|
| JP | 2003022698 | 1/2003 |
| KR | 1999-0005979 | 1/1999 |
| KR | 2003-0025116 | 3/2009 |

OTHER PUBLICATIONS

PCT International Search Report for Application No. PCT/US2008/070904 dated Dec. 30, 2008, 3 pages.

* cited by examiner

*Primary Examiner*—Son Dinh
(74) *Attorney, Agent, or Firm*—TraskBritt (57) ABSTRACT

A method, apparatus and system are disclosed for sensing and reporting voltage levels in a semiconductor device. One such voltage sensor and reporting device is configured to sense and compare a reference voltage and an operating voltage. In one or more embodiments the voltage sensor is also configured to generate an alarm signal if the difference between the operating voltage and the reference voltage indicates the operating voltage is outside of a normal operating range.

35 Claims, 3 Drawing Sheets

METHOD, SYSTEM, AND APPARATUS FOR VOLTAGE SENSING AND REPORTING

FIELD OF THE INVENTION

Embodiments of the present invention relate to voltage sensors and, particularly, in one or more embodiments, to determining and reporting various voltages on a semiconductor device, sensing and reporting methods, and systems including sensing and reporting capability.

BACKGROUND

Semiconductor devices, like most electronic products, are sensitive in their operation to supplied voltage levels. If voltage levels at working parts are lower than specified minimum requirements, the parts may malfunction. If voltage levels are higher than specified maximum requirements, the parts may malfunction and can also suffer catastrophic failure. In semiconductor memory devices, for example, such as Dynamic Random Access Memories (DRAMs), inadequate voltage levels may cause memory parts to malfunction by reading out or storing incorrect information. Such low voltage failures are often difficult to detect, and even when they are detected the resultant functional and data errors can seldom be recovered.

Often, the semiconductor device is still operational when the voltage levels become marginal causing the device to potentially fail in some aspect. For example, a memory device may not meet its full timing specifications at low voltages, resulting in a failure to read correct data. Even though the read data may be correct, the access time until correct data is available may be longer than designated by the device specification. Similarly, a low voltage level may result in the memory device's bit-cell capacitors not having enough time to fully change during a write cycle, even though they would work correctly if given additional time to complete the write cycle. In such a case, the bit-cells cannot be properly read and the data becomes corrupted.

There are many causes for unsuitable voltage levels to semiconductor devices, such as power supply errors and power distribution path effects. Power supply errors may result when the power supply is inadequate, misadjusted, or fails all together. Power distribution path effects influence voltage levels, for example through transient noise signals, inductance, and/or resistance in power distribution paths. As semiconductor device activity increases, these power distribution path effects often add together and further increase the chances of data and functional errors.

Historically, voltage sensors have been used to detect the voltage levels coming directly from the power supplies. However, these devices are limited to sensing voltage errors in he supply voltage. These systems are not capable of detecting whether voltage levels are unsuitable at specific locations (e.g., circuits) within the semiconductor device itself. Thus, these devices do not detect unsuitable voltage levels not caused by the voltage source itself, such as the distribution path effects described above.

In view of the shortcomings in the prior art, it would be advantageous to provide a semiconductor device capable of sensing and/or reporting voltage levels at operational circuits within the semiconductor device.

DETAILED DESCRIPTION

In the following detailed description, circuits and functions may be shown in block diagram form in order not to obscure the present invention in unnecessary detail. Additionally, block definitions and partitioning of logic between various blocks as depicted is non-limiting, and comprise examples of only specific implementations. It will be readily apparent to one of ordinary skill in the art that the present invention may be practiced in a variety of embodiments implementing numerous other partitioning solutions.

Figure 1:
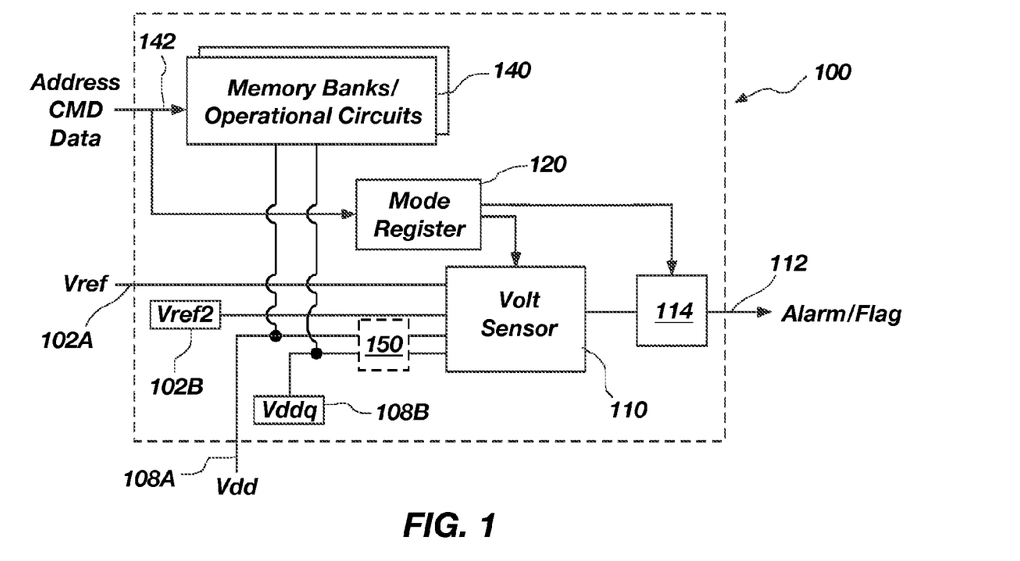
FIG. 1 is a block diagram illustrating a semiconductor memory device including a voltage sensing and reporting device according to one embodiment of the invention.

Also, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process is terminated when its acts are completed. A process may correspond to a method, a function, a procedure, a subroutine, a subprogram, etc. When a process corresponds to a function, its termination corresponds to a return of the function to the calling function or the main functions FIG. 1 is a block diagram illustrating a semiconductor memory device 100 including a voltage sensing and reporting device according to one embodiment. The semiconductor memory device 100 may be a DRAM with conventional memory banks and operational circuits 140 and be controlled by conventional address, command, and data buses 142. Semiconductor memory device 110 includes at least one voltage sensor 110 for sensing voltages. The at least one voltage sensor 110 may include a voltage comparator configured according to any of the known configurations in the art. The voltage comparator may be configured to compare an operating voltage (108A, 108B), such as $V_{dd}$ or $V_{ddq}$, to a reference voltage (102A, 102B), such as $V_{ref}$ or $V_{ref2}$, for determining a voltage difference. The term "voltage difference," as used herein, refers to a quantifiable difference between the operating voltage level and the reference voltage level, which difference may be expressed as a numerical value.

Figure 2:
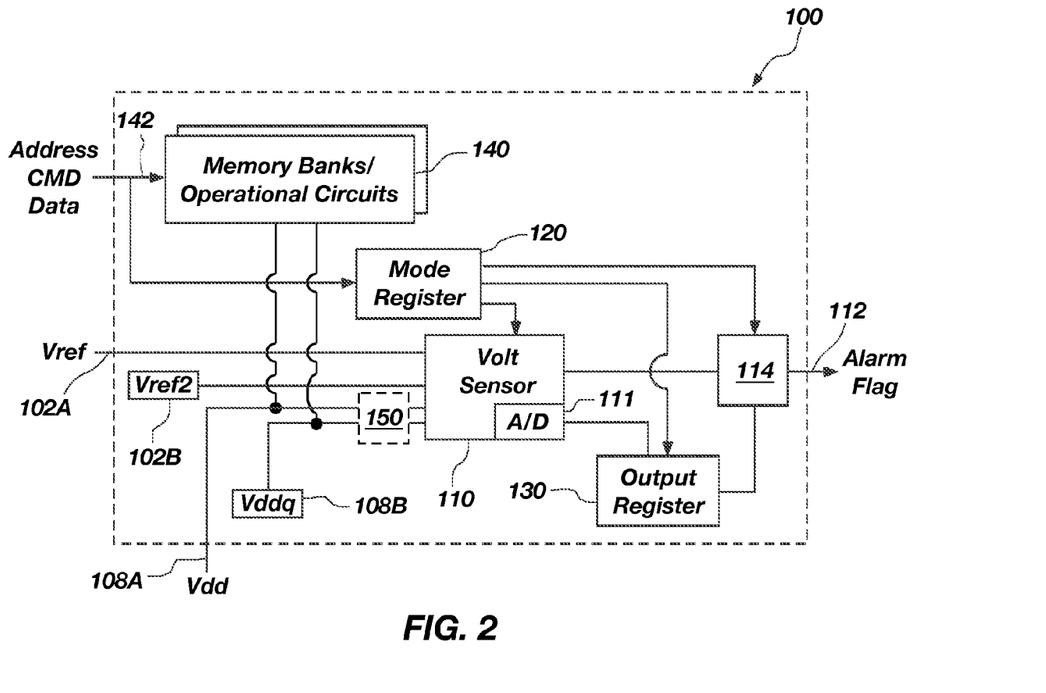
FIG. 2 illustrates a voltage sensing and reporting device including numeric result reporting according to one embodiment of the invention.

The operating voltage (108A, 108B) may be a supply voltage 108A from an input pin or may be an operating voltage 108B generated internally on the semiconductor memory device 100. The operating voltage (108A, 108B) may be configured to supply a voltage to one or more operational circuits 140 of the semiconductor memory device 100. By way of example and not limitation, operational circuits 140 may include column decoder circuits, write driver circuits, data read and write multiplexers, DC sense amplifiers, etc. Although FIGS. 1 and 2 illustrate the operating voltage (108A, 108B) coupled to operational circuits 140, one of ordinary skill in the art will recognize that the operating voltage (108A, 108B) may be further coupled to other elements in FIGS. 1 and 2 although it may not be specifically illustrated.

Similar to the operating voltage (108A, 108B), the reference voltage (102A, 102B) may be a supply voltage 102A from an input pin to the semiconductor device, or the reference voltage may be a reference voltage 102B generated internally on the semiconductor memory device 100 in any manner known in the art. By way of example and not limitation, the internally generated reference voltage 102B may be generated from a simple resistor voltage divider, a voltage drop generated by a forward biased diode, a reverse-biased Zener diode, or a bandgap reference circuit. Since different circuits of the semiconductor device may require different voltage levels, there may be more than one reference voltage in semiconductor memory device 1X. The reference voltage, as known in the art, may be characterized as a substantially constant voltage within conventional tolerances. In some embodiments, the reference voltage may comprise a ground as opposed to an actual voltage level.

The at least one voltage sensor 110 may be configured to compare the different reference voltages with different operating voltages. As a non-limiting example, voltage sensor 110 may be set to compare a first reference voltage $V_{ref}$ with a first operating voltage $V_{dd}$. Voltage sensor 110 may further be set to compare a second voltage reference $V_{ref2}$ with a second operating voltage $V_{ddq}$. It will be apparent to one of ordinary skill in the art that it is possible to compare a plurality of reference voltages with a plurality of operating voltages according to numerous combinations, including the disposition of more than one voltage sensor 110 on the semiconductor memory device 100. In some embodiments, a single voltage sensor 110 may be operably connected to compare a plurality of operating voltages to one or more reference voltages as described below.

Further, a voltage sensor 110 may be configured to signal an alarm in the case where the operating voltage is outside of a range. As used herein, "range" signifies the magnitude of the voltage is beyond a predetermined threshold level, which may be an upper or lower level relative to an expected, or normal operating voltage, and is not to be read as requiring the device to necessarily have an operating range sensed between an upper and a lower threshold. In some embodiments, the voltage sensor 110 may be configured to signal an alarm when the operating voltage is above an upper threshold or below a lower threshold, as determined from comparison with the reference voltage. In other embodiments, the voltage sensor 110 may be configured to signal an alarm only when the voltage level is below a lower threshold, while having no upper limit. In still other embodiments the voltage sensor 110 may be configured to signal an alarm only when the voltage level is above an upper threshold. Thus, use of the term "range" herein is not limited to embodiments requiring upper and lower thresholds.

If the operating voltage is above or below the relevant threshold, voltage sensor 110 may indicate the voltage failure by sending a flag such as alarm signal 112 to a pin on semiconductor memory device 100 for signaling the alarm externally. It is contemplated that voltage sensor 110 may be coupled to, and share a previously existing pin on semiconductor memory device 100, such as, for example, a boundary scan pin. One of ordinary skill in the art will recognize that any existing pin suitable for sharing may be used to communicate the voltage sensor output. Alternatively, a new pin may be provided on semiconductor memory device 100 with which voltage sensor 110 may be associated. As described above, there may be more than one voltage supplied within the semiconductor memory device 100. In this case a voltage sensor 110 may he provided for each supplied voltage, or, as described above, voltage sensor 110 may be configured to compare multiple reference voltages to multiple operating voltages. In the case where a voltage sensor 110 is provided for each voltage, the outputs for each of the voltage sensors may be connected to the same output pin through an optional output controller 114. By way of non-limiting example, output controller 114 may be configured as one or more logic "OR" gates, or as a multiplexer.

As stated, the pin on semiconductor memory device 100 for carrying the alarm signal 112 externally may be configured as a boundary scan output pin or other internal scan output pin. When not configured for performing a scan function, the scan output pin may be configured to carry the output from the output controller 114 (if present) or directly carry the alarm signal 112. For example, the pin can serve to carry the alarm signal 112 externally during normal operation, when scan functions or other similar functions are not being cared out. When placed into a maintenance or scan mode, the pin may be configured to carry out such other function or functions instead of carrying the alas signal 112.

The output pin may be operably coupled to any suitable external component, which may also be characterized as an external module. By way of example and not limitation, the output pin may be operably coupled to a memory controller, to receive the alarm signal 112 from the at least one voltage sensor 110. Upon receiving the alarm signal 112, the memory controller may be configured to adjust an operating parameter for the semiconductor memory device 100. As a non-limiting example, the memory controller may adjust the timing, and/or the power voltage levels for the semiconductor memory device 100. Adjusting the timing may allow more time to complete operations of the semiconductor memory device 100. For example, the adjustment may provide semiconductor memory device 100 with more time to complete reading and writing operations.

In another embodiment, and as a non-limiting example, the output pin of the semiconductor memory device 100 may be operably coupled to a maintenance system. The maintenance system may be configured to adjust an operating parameter for the semiconductor memory device 100 upon receiving the alarm signal 112. In still another embodiment, the output pin may be operably coupled to both a maintenance system and a memory controller.

With further reference to FIG. 1, a mode register 120 may be operably coupled to voltage sensor 110 and configured to control the operation of voltage sensor 110. By way of example and not limitation, mode register 120 may be an existing mode register within semiconductor memory device 100. For example, mode register 120 may be a mode register used for another function in semiconductor memory device 100. Alternatively, mode register 120 may be added as a unique register to the circuit architecture of semiconductor memory device 100. For example, mode register 120 may be added in an unused extended mode register position conventionally found in current DRAMs. The mode register 120 may be controlled and written to using conventional memory device commands. Mode register 120 may be configured to control voltage sensor 110 with one or more bits. At least one bit may be provided and used to enable and disable voltage sensor 110. One or more additional bits may be provided and used to select which voltage reference is to be used when there are more than one voltage references available. Additionally, mode register 120 may be configured to provide one or more bits for selecting which operating voltage to compare in the case that there are more than one operating voltages. In the case where there may be more tan one voltage sensor 110, one or more bits may be provided from mode register 120 to control additional voltage sensors. Mode register 120 may also be used to define and enable he adjustment of the upper and lower threshold value for each of the operating voltages (108A and 108B). Mode register 120 may additionally be used to select which voltage sensor 110 may communicate through the output pin on the semiconductor memory device 100. In some embodiments, mode register 120 may be coupled to output controller 114 to control the operations of output controller 114.

One of ordinary skill in the art will recognize that multiple mode registers may be used instead of just one, as described above, in appropriate situations. As a non-limiting example, a different mode register may be used to control each of a plurality of voltage sensors 110 on the semiconductor memory device 100. In addition, another mode register may be used to select which voltage sensor 110 is communicating through the alarm signal 112. The additional mode register may select a voltage sensor directly to communicate through the alarm signal 112, or the mode register may select which voltage sensor may communicate by controlling output controller 114. In addition, if the alarm signal 112 is configured on a scan output pin, the mode register 120 may control whether the scan output pin is configured to carry the alarm signal 112, or conventional scan output signals.

As described above, in some embodiments a single voltage sensor 110 may be operably connected to compare a plurality of operating voltages to one or more reference voltages. In these embodiments, a multiplexer 150 (shown in broken lines in FIG. 1) may be employed to control which operating voltage is being compared with a reference voltage. The multiplexer 150 may further control the duration of time each operating voltage is compared wit the reference voltage. A suitable multiplexer 150 may comprise transmission gates so that the operating voltages are sent through the multiplexer 150 to the voltage sensor 10. Additionally, a suitable multiplexer 150 may exhibit an impedance that is relatively low compared to the other transmission line impedances. In such embodiments, a mode register as described above may be employed to control the multiplexer 150 and the rate at which the different operating voltages are compared.

Additionally, one of ordinary skill in the art will recognize that embodiments of the present invention may be configured without a mode register. As a non-limiting example, a voltage sensor 110 may be configured to compare a single operating voltage (108A or 108B) with a single reference voltage (102A or 102B) and to generate alarm signal 112 in the case the voltage difference is greater than a preset level.

FIG. 2 illustrates a voltage sensing and reporting device including numeric result reporting according to one embodiment. At least one voltage sensor 110 may include an analog-to-digital (A/D) converter 111. A/D converters are well known in the art and any suitable A/D converter may be employed. The A/D converter 111 may be used to convert the voltage difference between the reference voltage (102A, 102B) and the operating voltage (108A, 108B) to a numeric value specified by one or more bits. In embodiments in which the reference voltage is a ground, as described above, the A/D converter 111 may be used to convert the operating voltage to a numeric value relative to the ground. An output register 130 may be operably coupled to an output of the A/D converter 111 and configured to receive and store the numeric value of the voltage difference from the at least one voltage sensor 110. As a non-limiting example, an operating voltage that is too low may be sensed in a voltage sensor 110 and compared to the reference voltage. The value of the voltage difference may be indicated by a numeric value converted by the A/D converter. The numeric value may be in the form of a plurality of bits such as, for example, a byte. The numeric value may be sent from the A/D converter 111 to the output register 130 either serially, if there is only a single communication line, or through a bus (not shown). The numeric value may be stored in output register 130. Output register 130 may be further operably coupled to the same output pin configured to carry alarm signal 112 and may be configured to send the numeric value serially to the output pin as either part of or separate from a scan path.

As described above, the output pin may be operably coupled to any suitable external component, which may also be described as an external module, such as a memory controller, a maintenance system, etc. In embodiments similar to that illustrated in FIG. 2, the suitable external component may receive the alarm signal 112 generated by the voltage sensor 110. By way of example and not limitations the suitable external component may comprise a memory controller. Upon receipt of the alarm signal 112, the memory controller may send control bits to the mode register(s) 120 indicating that output register 130 should send its contents out on the alarm signal 112 in a serial fashion. The mode register 120 may control the output register 130 and output controller 114 to cause the serial output to occur. As with the alarm signals, the output register content may be serially scanned out on a dedicated signal pin, another multiple function pin, an internal scan pin, a boundary scan pin, etc.

In some embodiments, as described above, mode register 120 may be operably coupled and configured to control output register 130. Similar to FIG. 1, above, mode register 120 may be the same mode register used to control voltage sensor 110 and/or output controller 114. In other embodiments, mode register 120 may be a separate mode register from the mode register configured to control voltage sensor 110 and output controller 114. Mode register 120 may provide one or more bits for controlling the operation of output register 130.

Similar to FIG. 1, above, the embodiment illustrated in FIG. 2 may include a single voltage sensor 110 operably connected to compare a plurality of operating voltages to one or more reference voltages. These embodiments may include the multiplexer 150 as described above with relation to FIG. 1.

Figure 3:
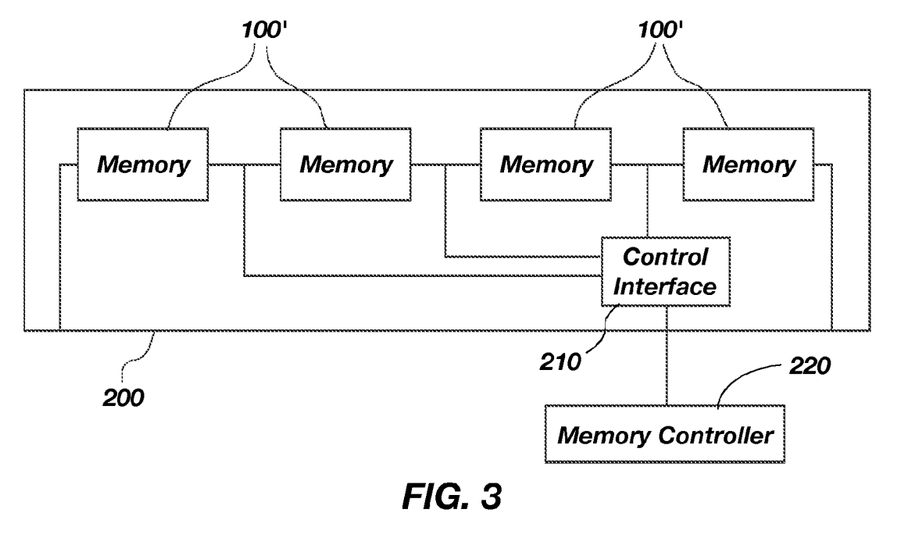
FIG. 3 is a memory card containing a plurality of semiconductor memory devices containing a voltage sensing and reporting device according to one embodiment of the invention.
Figure 4:
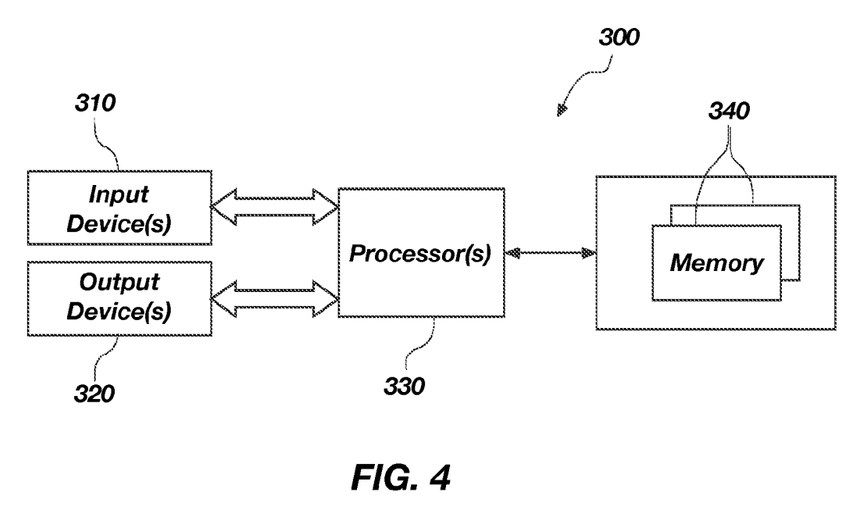
FIG. 4 is a computing system diagram showing a plurality of semiconductor memories containing a voltage sensing and reporting device according to one embodiment of the invention.

As shown in FIG. 3, a substrate 200, such as a printed circuit board (PCB), in accordance with an embodiment of the present invention, includes a plurality of semiconductor memory devices 100', at least one of which incorporates at least one embodiment of a voltage sensing and reporting device as described herein. It should be understood that each semiconductor memory device 100' might comprise one of a wide variety of devices, including, for example, Dynamic RAM (DRAM) devices, Static RAM (SRAM) devices, and Flash memory devices. The output pin configured to carry the alarm signal of each of the semiconductor memory devices 100' hat support the voltage sensing function may be operably coupled to a suitable external component, which may also be characterized as set forth above as an external module, that is configured to receive the alarm signal 112. For example, the output pins may be operably coupled to a memory controller 220 through a memory controller interface 210. Upon receiving the alarm signal 112, the memory controller 220 may adjust an operating parameter as described above. As shown in FIG. 4 an electronic system 300, such as a computer system, in accordance with an embodiment of the present invention, comprises at least one input device 310, at least one output device 320, at least one processor 330, and at least one memory device 340. As used herein, the term "computer system" includes not only computers such as personal computers and servers, but also wireless communications devices (e.g., cell phones, personal digital assistants configured for text messaging and email), cameras, chip sets, set top boxes, controllers, vehicle and engine control and sensor systems, and other combinations of the above-referenced input, output, processor and memory devices. The at least one memory device 340 comprises at least one semiconductor memory device 100 incorporating at least one of the voltage sensing and reporting device described herein according to an embodiment of the invention. As a non-limiting example, each memory device 340 may comprise a module configured as a substrate 200 bearing multiple semiconductor memory devices 100 as is illustrated in FIG. 3. It should be understood that the semiconductor memory devices 100 may be selected from a wide variety of devices, including, for example, Dynamic RAM (DRAM) devices, Static RAM (SRAM) devices, and Flash memory devices, and combinations thereof.

Furthermore, embodiments of the present invention can be implemented in types of semiconductor devices other than memories. By way of non-limiting example, embodiments of the present invention may be implemented in microprocessors, microcontrollers, system-on-a-chip, and image sensors. As a non-limiting example, in a microprocessor or microcontroller, clock speed, execution unit operation, and memory access times may be adjusted responsive to results from the voltage sensor 110 (FIGS. 1 and 2). As another non-limiting example in an image processor, operational parameters such as integration time, pixel reset times, pixel reset voltages, analog-to-digital conversion operations, and signal processing operations such as bit repairs and image compression may be adjusted responsive to results from the voltage sensor 110.

One of ordinary skill in the art will recognize that when implemented in semiconductor devices other than memories, the mode register(s) used to control the voltage sensor 110, output controller 114, and output register(s) 130 would be written to using command appropriate for the semiconductor device rather than conventional memory commands that may be used in a DRAM or flash memory device.

Figure 5:
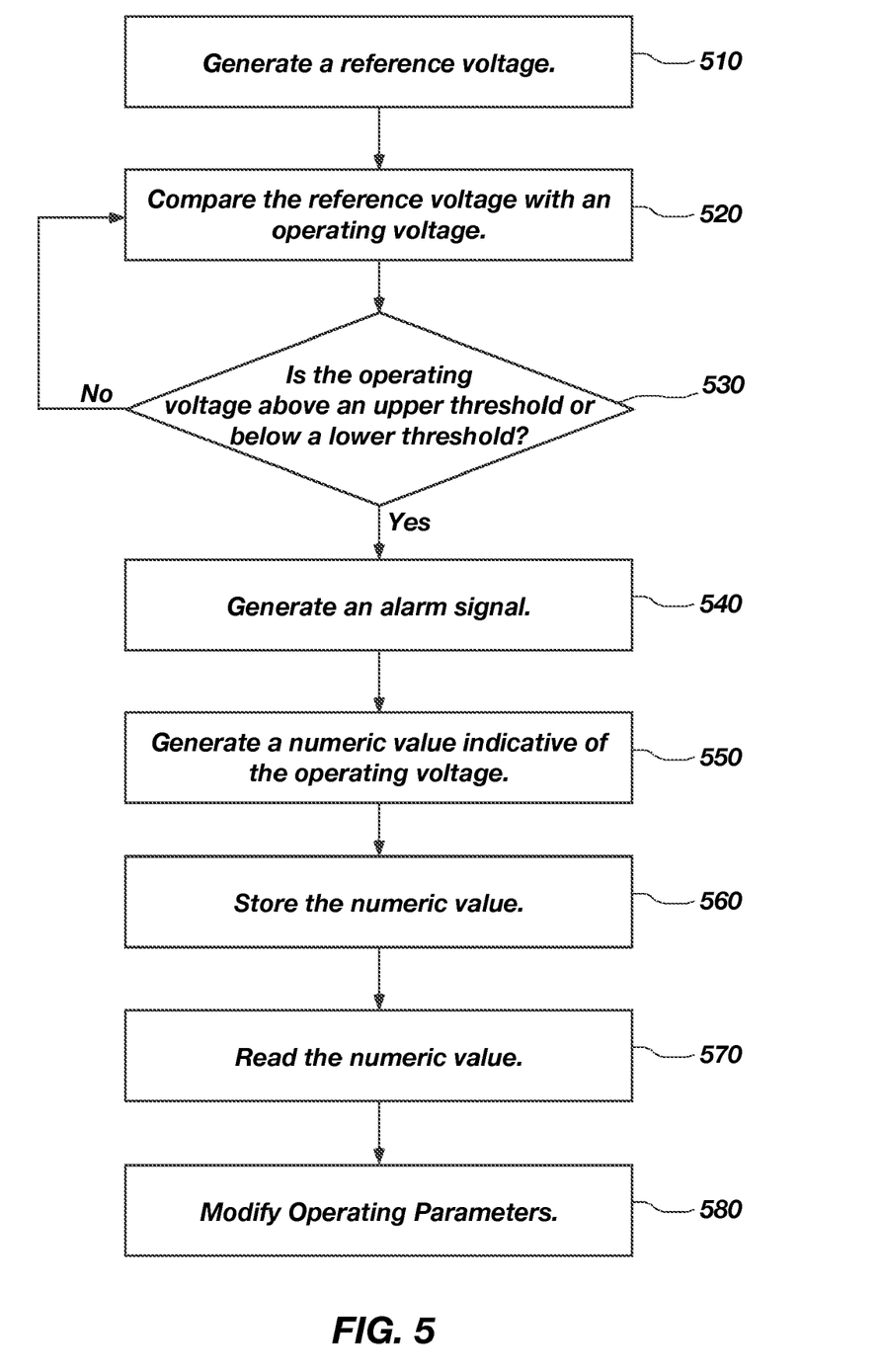
FIG. 5 is a flow diagram illustrating a method for sensing and reporting voltage in a semiconductor memory device according to one embodiment of the invention.

FIG. 5 illustrates one embodiment of a method of sensing and reporting voltage levels in a semiconductor memory device. A reference voltage may be generated at 510. The reference voltage may be generated, for example, from a power supply, a simple resistor voltage divider, a voltage drop generated by a forward biased diode, a reverse-biased Zener diode, a bandgap reference circuit, an external voltage source, or any other method known to those of ordinary skill in the art. The reference voltage may be compared to an operating voltage in a voltage sensor at 520. The reference voltage and operating voltage may be compared in a voltage comparator. The voltage sensor may determine whether the operating voltage is within an acceptable range above an upper threshold or below a lower threshold at 530. If the operating voltage is within normal operating conditions, e.g., below the upper threshold and above the lower threshold, the process returns to comparing the operating voltage with the reference voltage. It however, the operating voltage is outside of the normal operating range, e.g., below a lower threshold or above an upper threshold, an alarm signal may be generated at 540. The upper and lower thresholds selected may vary according to the specific application. In some embodiments, the sequence illustrated in FIG. 5 may end at this point and may use an external device (e.g., a maintenance system) for providing outside support such as adjustments to one or more operational parameters.

In other embodiments, a numeric value indicative of the operating voltage may be generated at 550. The numeric value may then be stored for later retrieval at 560, and the stored numeric value may be retrieved and read by another device at 570. By way of example, and not limitation, the numeric value may be stored in an output register, and retrieved by a control module. Those of ordinary skill in the art will recognize that the numeric value may be stored in any suitable register or memory location. Additionally, the alarm, the numeric value, or both, may be made available to any external module determined by the designer to be suitable. By way of example and not limitation, the alarm, the numeric value, or both, may be made available to at least one of a memory controller and a maintenance system. Adjustments may be made to one or more operational parameters on the semiconductor memory device to compensate for the power issues based on at least one of the alarm signal and the numeric value at 580.

CONCLUSION

In one embodiment of the present invention a semiconductor device may employ at least one reference voltage. At least one operating voltage may be employed, associated with at least one circuit of the semiconductor device. At least one voltage sensor is configured to compare the at least one reference voltage and the at least one operating voltage. The voltage sensor may, optionally, be configured to generate an alarm signal if a difference between the operating voltage and the reference voltage is greater than a predetermined amount.

In another embodiment of the invention, a memory card comprising a plurality of memory devices is provided. At least one of the memory devices is configured with at least one voltage sensor as described above.

Another embodiment of the invention comprises an electronic system. The electronic system may include at least one input device, at least one output device, a processor, and at least one memory device configured with at least one voltage sensor as described above An embodiment of a method for sensing and reporting a voltage in a semiconductor device is also provided, the method including comparing an operating voltage to a reference voltage and determining whether the operating voltage is outside a predetermined voltage range. The method may further include generating an alarm signal when the operating voltage is outside the predetermined voltage range.

While certain embodiments have been described and shown in the accompanying drawings, such embodiments are merely illustrative and not restrictive of the scope of the invention, and this invention is not limited to the specific constructions ad arrangements shown and described, since various other additions and modifications to, and deletions from, the described embodiments will be apparent to one of ordinary skill in the an. Thus, the scope of the invention is only limited by the literal language, and equivalents, of the claims which follow.

What is claimed is:

1. A semiconductor device, comprising:
   at least one voltage sensor configured to compare at least one reference voltage and at least one operating voltage associated with at least one operational circuit of the semiconductor device;
   wherein the at least one voltage sensor is configured to signal an alarm if a difference between the at least one operating voltage and the at least one reference voltage indicates the at least one operating voltage is outside of a selected range; and wherein the semiconductor device is configured to signal the alarm externally.

2. The semiconductor device of claim 1, further comprising at least one mode register operably coupled to the at least one voltage sensor and configured to control the operation of the at least one voltage sensor.

3. The semiconductor device of claim 2, wherein at least one of the at least one voltage sensor, the at least one reference voltage and the at least one operating voltage respectively comprises a plurality thereof.

4. The semiconductor device of claim 3, wherein the at least one mode register is configured to perform at least one of the following functions: enable/disable the at least one voltage sensor; if the at least one reference voltage comprises a plurality, select a reference voltage of the plurality of reference voltages; if the at least one operating voltage comprises a plurality, select an operating voltage of the plurality of operating voltages; define an upper and a lower threshold value for the at least one voltage sensor; and if the at least one voltage sensor comprises a plurality, select a voltage sensor of the plurality of voltage sensors to signal the alarm externally.

5. The semiconductor device of claim 1, wherein the alarm is signaled externally through at least one internal scan output pin.

6. The semiconductor device of claim 2, wherein the at least one mode register is configured to control an internal scan output pin to switch between carrying one of the alarm signal and at least one other scan output signal.

7. The semiconductor device of claim 1, wherein the at least one voltage sensor is further configured to generate a numeric value related to the at least one operating voltage.

8. The semiconductor device of claim 7, further comprising at least one output register operably coupled to the at least one voltage sensor and configured to receive and store the numeric value.

9. The semiconductor device of claim 1, wherein the at least one reference voltage is provided by a voltage source selected from the group consisting of an input pin, a resistor voltage divider, a voltage drop across a forward biased diode, a reverse-biased Zener diode, and a bandgap reference circuit.

10. The semiconductor device of claim 1, wherein the at least one operating voltage comprises a plurality of operating voltages.

11. The semiconductor device of claim 10, wherein the at least one voltage sensor comprises a plurality of voltage sensors and the at least one reference voltage comprises a plurality of reference voltages, wherein each of the plurality of voltage sensors is configured to compare at least one of the plurality of operating voltages to one of the plurality of reference voltages.

12. The semiconductor device of claim 10, further comprising:
wherein the at least one voltage sensor comprises a single voltage sensor; and
multiplexer operably coupled to the single voltage sensor and the plurality of operating voltages, and configured to control which operating voltage of the plurality of operating voltages is compared with the at least one reference voltage.

13. The semiconductor device of claim 1, wherein the selected range comprises at least one of an upper threshold and a lower threshold.

14. A memory card comprising:
a plurality of memory devices, at least one of the plurality of memory devices comprising at least one voltage sensor configured to cause an alarm to be signaled from the at least one memory device responsive to a difference between at least one operating voltage associated with at least one circuit of the at least one memory device of the plurality and at least one reference voltage, the alarm indicating the at least one operating voltage is outside of a range.

15. The memory card of claim 14, wherein the at least one of the plurality of memory devices is operably coupled to a memory controller configured to receive the alarm signal.

16. The memory card of claim 15, wherein the memory controller is further configured to adjust at least one operating parameter of the at least one of the plurality of memory devices responsive to receipt of the alarm signal.

17. The memory card of claim 14, further comprising:
wherein the at least one voltage sensor comprises a single voltage sensor;
wherein the at least one operating voltage comprises a plurality of operating voltages; and
a multiplexer operably coupled to the single voltage sensor and the plurality of operating voltages, and configured to control which operating voltage of the plurality of operating voltages is compared with the at least one reference voltage.

18. The memory card of claim 14, wherein the at least one voltage sensor is further configured to generate a numeric value associated with the at least one operating voltage.

19. The memory card of claim 18, wherein the at least one memory device further comprises at least one output register operably coupled to the at least one voltage sensor and configured to receive and store the numeric value.

20. The memory card of claim 14, wherein the plurality of memory devices comprise at least one device selected from the group consisting of a Dynamic RAM (DRAM), a Synchronous DRAM (SDRAM), a Static RAM (SRAM), and a Flash memory.

21. The memory card of claim 14, wherein the at least one reference voltage is provided by a voltage source selected from the group consisting of an input pin, a resistor voltage divider, a voltage drop across a forward biased diode, a reverse-biased Zener diode, and a bandgap reference circuit.

22. The memory card of claim 14, wherein the at least one memory device of the plurality of memory devices further comprises at least one mode register operably coupled to the at least one voltage sensor and configured to control the operation of the at least one voltage sensor.

23. The memory card of claim 22, wherein the at least one mode register is configured to perform at least one of the following functions: enable/disable the at least one voltage sensor; select the at least one reference voltage; select the at least one operating voltage; define an upper and a lower threshold value for the at least one voltage sensor; select the at least one voltage sensor to signal the alarm externally; and control an internal scan output pin to switch between carrying one of the alarm and at least one other scan output signal.

24. The memory card of claim 14, wherein the range comprises at least one of an upper threshold and a lower threshold.

25. An electronic system comprising:
a processor; and
at least one memory device comprising at least one voltage sensor for determining a difference between at least one reference voltage and at least one operating voltage associated with at least one circuit of the at least one memory device and to cause the at least one memory device to signal an alarm if the difference indicates the at least one operating voltage is outside of a range.

26. The electronic system of claim 25, wherein the at least one memory device is selected from the group consisting of a Dynamic RAM (DRAM), a Synchronous DRAM (SDRAM), a Static RAM (SRAM), and a Flash memory.

27. The electronic system of claim 25, further comprising at least one of a memory controller and a maintenance system for adjusting at least one operating parameter of the at least one memory device responsive to the alarm signal.

28. A method for sensing and reporting a voltage in a semiconductor device, comprising:
   comparing an operating voltage for at least one operational circuit of the semiconductor device to a reference voltage; and
   signaling an alarm if the operating voltage is outside a voltage range.

29. The method of claim 28, further comprising:
   generating a numeric value indicative of a voltage level of the operating voltage.

30. The method of claim 29, wherein generating a numeric value comprises:
   converting the voltage level of the operating voltage to a digital value; and
   generating a multiple-bit digital number.

31. The method of claim 28, further comprising:
   adjusting at least one operational parameter of the semiconductor device to compensate for the operating voltage being outside the voltage range.

32. The method of claim 31, wherein adjusting at least one operational parameter comprises adjusting at least one of a timing parameter, a clock speed parameter, execution unit operation, pixel reset voltages, analog-to-digital conversion operations, and signal processing operations.

33. The method of claim 28, further comprising generating the reference voltage from at least one from the group consisting of an input pin, a resistor voltage divider, a voltage drop across a forward biased diode, a reverse-biased Zener diode, and a bandgap reference circuit.

34. The method of claim 28, wherein signaling an alarm if the operating voltage is outside a voltage range comprises signaling the alarm externally through at least one internal scan output pin.

35. The method of claim 28, wherein the voltage range comprises at least one of an upper threshold and a lower threshold.

* * * * *

UNITED STATES PATENT AND TRADEMARK OFFICE
CERTIFICATE OF CORRECTION

PATENT NO. : 7,692,996 B2  Page 1 of 1
APPLICATION NO. : 11/830531
DATED : April 6, 2010
INVENTOR(S) : David R. Resnick It is certified that error appears in the above-identified patent and that said Letters Patent is hereby corrected as shown below:

In column 9, line 55, in Claim 12, before "multiplexer" insert -- a --.

Signed and Sealed this

Eighth Day of June, 2010

David J. Kappos
*Director of the United States Patent and Trademark Office*